(12) United States Patent
Park (10) Patent No.: US 6,623,988 B2
(45) Date of Patent: Sep. 23, 2003

(54) METHOD FOR FABRICATING FERROELECTRIC CAPACITOR OF SEMICONDUCTOR DEVICE

(75) Inventor: Won Kyu Park, Taegu (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/124,251

(22) Filed: Apr. 18, 2002

(65) Prior Publication Data

US 2002/0155626 A1 Oct. 24, 2002

(30) Foreign Application Priority Data

Apr. 19, 2001 (KR) ...................................... P2001-21204

(51) Int. Cl.[7] .................................................. H01G 7/06
(52) U.S. Cl. ........................................... 438/3; 438/240
(58) Field of Search ...................................... 438/3, 240

(56) References Cited

U.S. PATENT DOCUMENTS 5,976,920 A * 11/1999 Nakano et al. ............. 438/172
6,207,499 B1 * 3/2001 Hoshi .......................... 438/253

* cited by examiner

Primary Examiner—Jey Tsai
(74) Attorney, Agent, or Firm—Finnegan, Henderson, Farabow, Garrett, & Dunner, L.L.P.

(57) ABSTRACT

A method for fabricating a ferroelectric capacitor of a semiconductor device is disclosed. This method carries out a patterning process of a capacitor electrode, which is difficult to handle in a dry etching process, with a lift-off method using a negative slope, photomask thereby ensuring stability in a fabricating process and enabling a control of parasitic capacitance. The method for fabricating a ferroelectric capacitor of a semiconductor device comprises depositing a photoresist, forming a mask by patterning the photoresist to have sides with a negative slope from an upper portion of the sides to a lower portion of the sides, forming a material layer for forming electrodes or a ferroelectric material layer to prevent deposition materials to come into contact with the side of the mask, eliminating the material layer for forming electrodes or the ferroelectric material layer on an upper surface of the mask with a lift-off method, while eliminating the mask at the same time.

16 Claims, 6 Drawing Sheets

METHOD FOR FABRICATING FERROELECTRIC CAPACITOR OF SEMICONDUCTOR DEVICE

CROSS-REFERENCE TO RELATED APPLICATION

This application claims benefit of priority under 35 U.S.C. §119 to Korean Application Serial No. 2001-21204 filed Apr. 19, 2001, the entire contents of which are incorporated by reference herein.

DESCRIPTION OF THE INVENTION

1. Field of the Invention

The present invention relates to a semiconductor device, and more particularly, to a method for fabricating a ferroelectric capacitor of a semiconductor device, whereby a capacitor electrode, which is difficult to handle in a dry etching process, is patterned by a lift-off method using a photoresist mask having a negative slope, thereby ensuring stability in a fabrication process and enabling control of parasitic capacitance.

2. Background of the Invention

With high packing density in semiconductor memory devices such as dynamic random access memories (DRAM), operational characteristics, such as refresh characteristics, are becoming a major issue in semiconductor devices. Accordingly, in order to ensure desired operational characteristics, a technique ensuring sufficient electrostatic capacitance in capacitors has been developed.

Therefore, thin film materials such as $SrBi_2Ta_2O_9$ (SBT) and Pb $(ZrxTil-x)O_3$(Lead Zirconium Titanium, PZT) are useful as dielectrics in capacitors of advanced generation semiconductor memory devices and a nonvolatile memory devices, such as ferroelectric random access memory (FERAM).

When SBT is deposited by a coating process, the process is carried out with SBT in gel form. In this case, problems related to partial failure in uniformity may occur, and it is difficult to ensure uniform capacitance of wafers.

An upper electrode of a capacitor is formed with materials identical to those of a lower electrode. Such materials include platinum (Pt), which is highly acid-resistant, and conductive oxides, such as $IrO_2$ and $RuO_2$, or metals, such as Ir and Ru. In a ferroelectric capacitors, SBT films are used mostly as dielectric films and platinum films are used mostly as electrodes.

A related art method for fabricating a ferroelectric capacitor of a semiconductor device will be described with reference to the accompanying drawings.

FIGS. 1A to 1J are sectional views illustrating process steps for fabricating a ferroelectric capacitor in the related art.

Figure 1A:
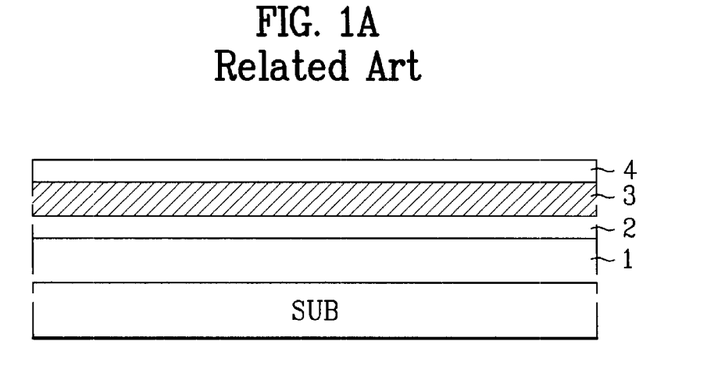
FIGS. 1A to 1J are sectional views illustrating process steps for fabricating a ferroelectric capacitor in the related art.

First, as shown in FIG. 1A, a material layer 2 for forming a lower electrode of a capacitor is formed on an oxide film 1 by depositing materials, such as Pt, using a sputtering method.

Then, an SBT film is coated on material layer 2 to form a dielectric layer 3. Pt is deposited on dielectric layer 3 by a sputtering method to form a material layer 4 for forming an upper electrode.

Figure 1B:
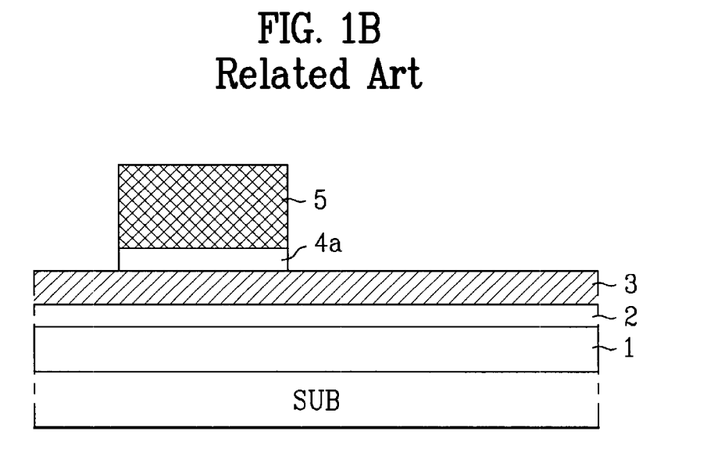

Subsequently, as shown in FIG. 1B, a first photoresist is deposited on material layer 4 and then selectively patterned to form a first mask 5.

Afterwards, the exposed material layer 4 is selectively etched by a dry etching process, using first mask 5, to form an upper electrode 4a. First mask 5 is then removed.

Figure 1C:
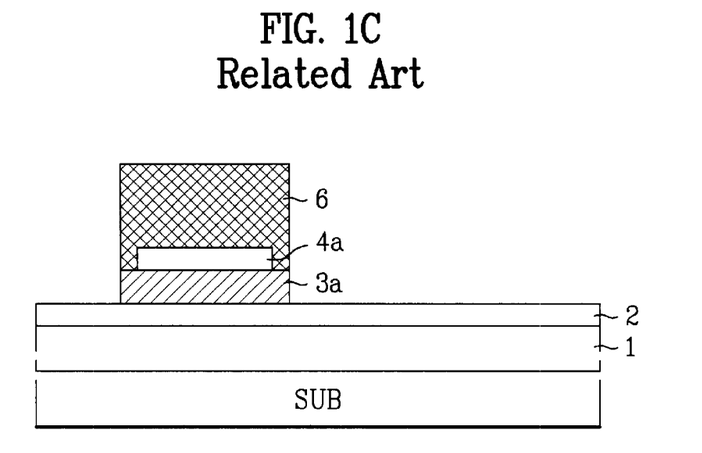

In addition, as shown in FIG. 1C, a second photoresist is deposited on dielectric layer 3, including upper electrode 4a. The second photoresist is then selectively patterned to leave the second photoresist wider than upper electrode 4a and surrounding upper electrode 4a, so that a second mask 6 is formed.

Exposed dielectric layer 3 is selectively etched using second mask 6 to form a capacitor dielectric layer 3a. Second mask 6 is then removed.

Figure 1D:
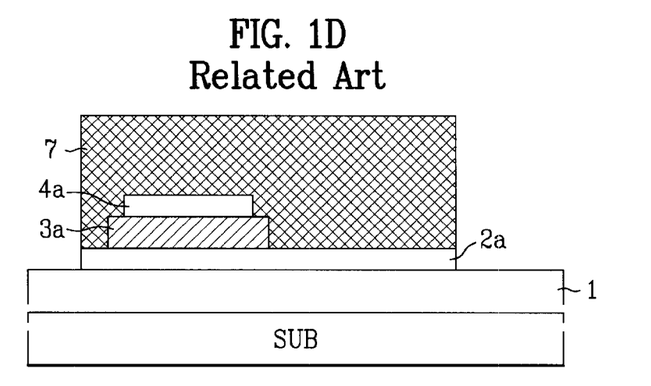

Subsequently, as shown in FIG. 1D, a third photoresist is deposited on material layer 2 including patterned upper electrode 4a and capacitor dielectric layer 3a. The third photoresist is then selectively patterned to leave the third photoresist wider than patterned upper electrode 4a and capacitor dielectric layer 3a and surrounding patterned upper electrode 4a and capacitor dielectric layer 3a, to form a third mask 7.

Then, by selectively etching the exposed material layer for forming lower electrode, using third mask 7, a lower electrode 2a is formed. Third mask 7 is then removed.

Figure 1E:
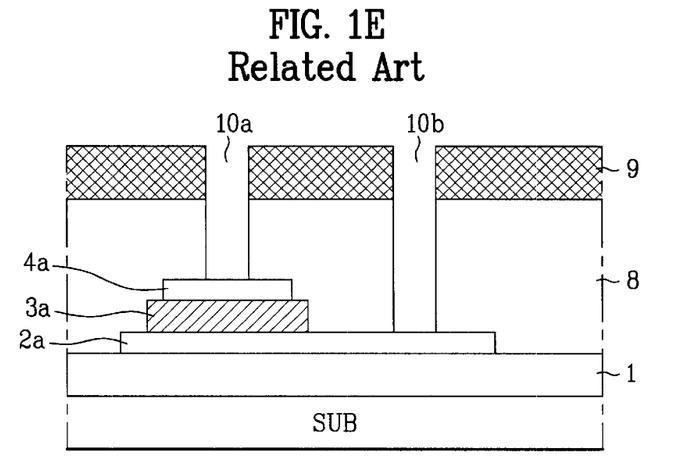

Additionally, as shown in FIG. 1E, a Pre-Metal Dielectric (PMD) layer 8 is formed on the entire surface, and a fourth photoresist is deposited thereon. Then, a capacitor contact region is defined and the fourth photoresist is patterned according to the capacitor contact region to form a fourth mask 9.

Then, PMD layer 8 is selectively etched using fourth mask 9 to form a first contact hole 10a and a second contact hole 10b. The first contact hole 10a exposes a partial surface of upper electrode 4a. Second contact hole 10b exposes a partial surface of the lower electrode 2a. Fourth mask 9 is then removed.

Figure 1F:
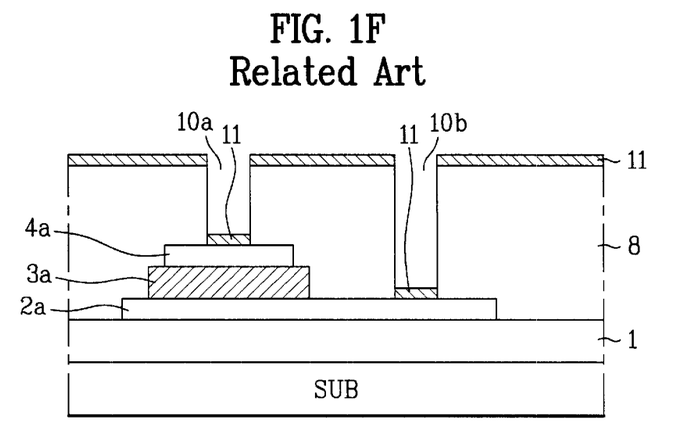

Subsequently, as shown in FIG. 1F, TiN is deposited on a surface of PMD layer 8, including the bottom surfaces of first contact hole 10a and second contact hole 10b to form a barrier layer 11.

Figure 1G:
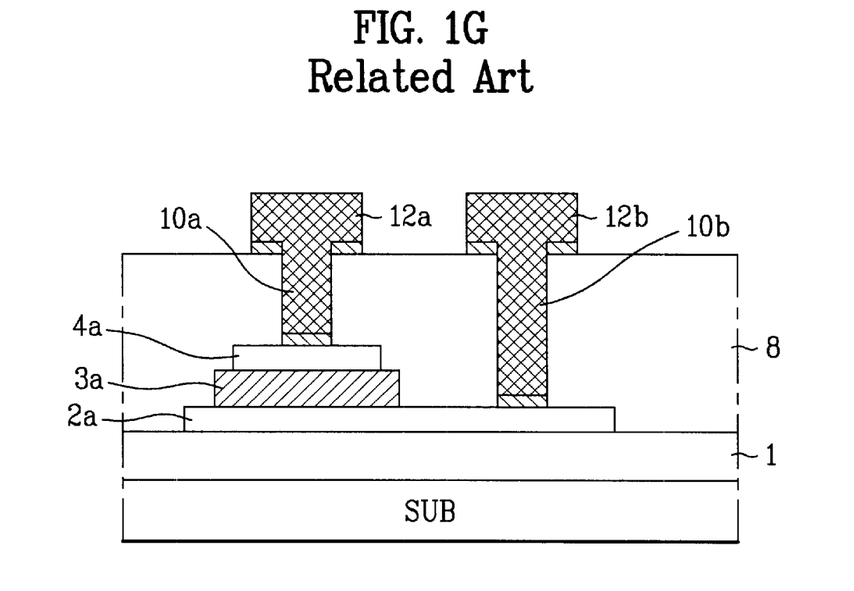

As shown in FIG. 1G, first contact hole 10a and second contact hole 10b are masked using a fifth photoresist, and exposed barrier layer 11 is removed to form contact excluding the capacitor forming region.

Figure 1H:
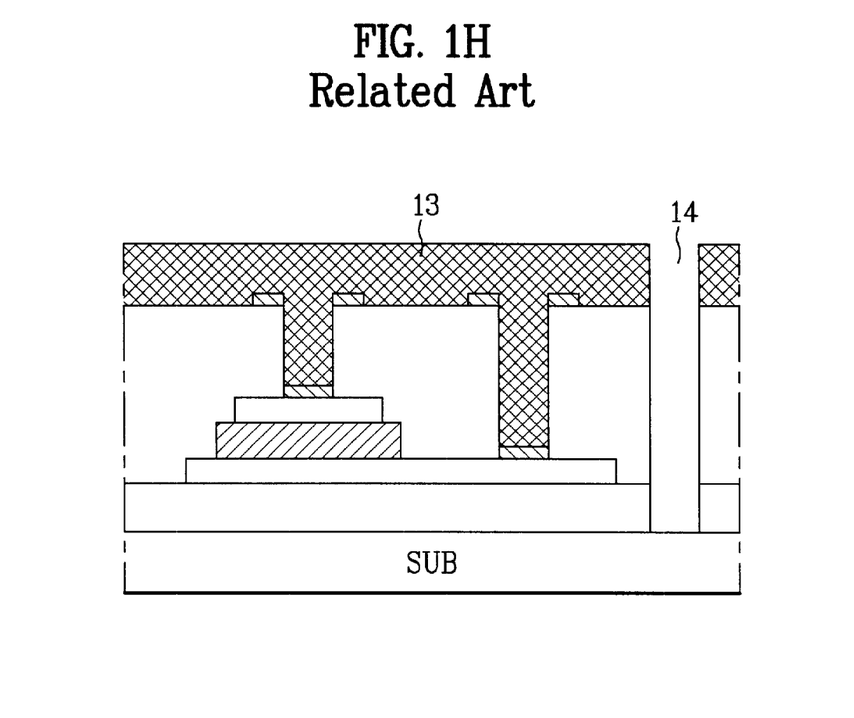

Furthermore, as shown in FIG. 1H, the fifth photoresist is deposited on the entire surface and then selectively patterned to form a fifth mask 13. An inner line contact hole 14 is then formed using fifth mask 13.

Figure 1I:
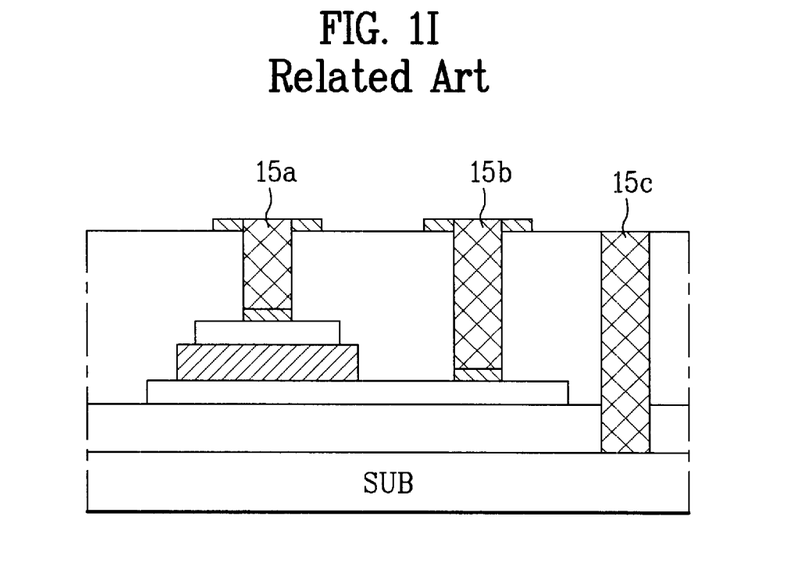

Then, as shown in FIG. 1I, multilayered metals consisting of layers of TI, TiN, and W having thickness of 900 Å, 300 Å, and 500 Å respectively are buried within first contact hole 10a, second contact hole 10b, and inner line contact hole 14, so that plug layers 15a, 15b, and 15c are formed.

Figure 1J:
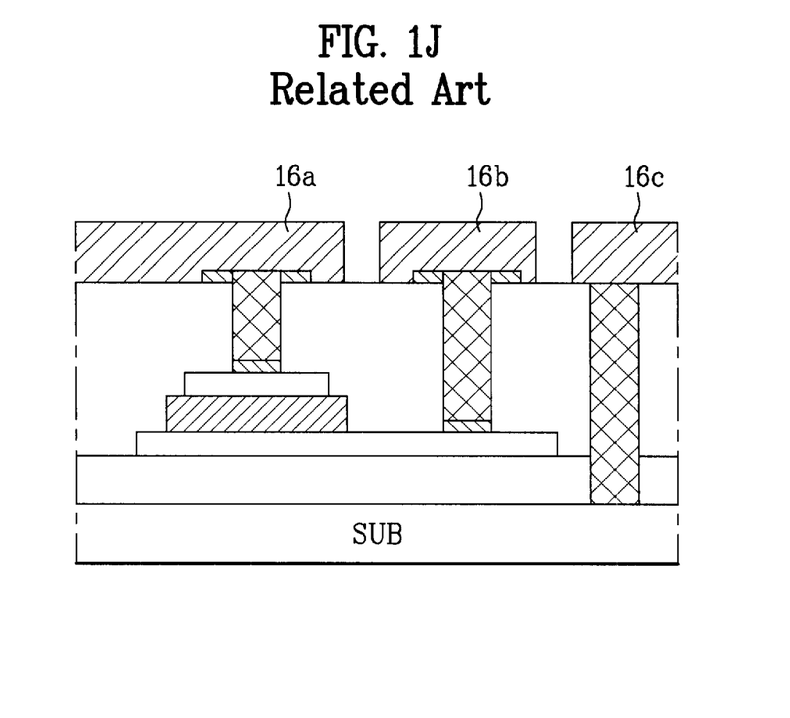

Finally, as shown in FIG. 1J, multilayered metals consisting of layers of Ti, TiN, and Al having thickness of 100 Å, 150 Å, and 5000 Å, are deposited on the entire surface including plug layers 15a, 15b, and 15c and then selectively patterned by a photolithography process to form metal line layers 16a, 16b, and 16c.

In related art processes of forming ferroelectric capacitors, a number of masks are separately used when electrodes of the capacitor are formed. In this case, it is difficult to maintain alignment among the different masks.

Therefore to ensure a desired process margin, an area occupied by the capacitor to ensure a process margin may become inefficiently large.

Consequentially, related art methods for fabricating a ferroelectric capacitor have several problems.

One of the problems is that due to the gel form coating of SBT, which is used as a ferroelectric substance, the profile of the SBT is partially unequal. Therefore, it is difficult to maintain the capacitance of an equal wafer level. This is due to typical characteristics of the coating process, whereby a film around the central part of a rotary shaft is thick and as the film nears the edge it becomes thinner.

Another problem is that electrodes are formed through a dry etching process using a photoresist mask. Therefore, due to an unusual electric field peak occurring at edges of the electrodes, it is difficult to distribute charges uniformly.

In addition, due to repeated formation of masks and patterning using the masks, it is difficult to maintain alignment among the different masks.

Furthermore, residues of materials, such as tungsten, remain due to the barrier layer formed at an opening of the contact hole during the formation of plug layers. This may reduce insulating characteristics of the capacitors.

Finally, there may be a degradation of the electrode in relation with the dry etching process during the patterning process of the electrode using Pt, thereby degrading the entire characteristics of a capacitor.

SUMMARY OF THE INVENTION

Accordingly, the present invention is directed to a method for fabricating a ferroelectric capacitor in a semiconductor device that substantially obviates one or more problems due to limitations and disadvantages of the related art.

The present invention provides a method for fabricating a ferroelectric capacitor of a semiconductor device patterning capacitor of electrodes, which is difficult to handle in a dry etching process, with a lift-off method using photoresist mask having a negative slope, and thereby ensuring stability in the fabricating process and enabling control of parasitic capacitance.

Additional advantages and features of the invention will be set forth in part in the description which follows and in part will become apparent to those having ordinary skill in the art upon examination of the following or may be learned from practice of the invention. Other advantages of the invention may be realized and attained by the structure particularly pointed out in the written description and claims hereof as well as the appended drawings.

To achieve these advantages and in accordance with the purposes of the invention, as embodied and broadly described herein, a method for fabricating ferroelectric capacitor of semiconductor device comprises depositing a photoresist, forming a mask by patterning the photoresist to have sides with a negative slope from an upper portion of the sides to a lower portion of the sides, forming a material layer for forming electrodes or a ferroelectric material layer to prevent deposition materials to coming into contact with the side of the mask, and removing the material layer for forming electrodes or the deposition material layer on the upper surface of the mask, while removing the mask at the same time.

It is to be understood that both the forgoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DESCRIPTION OF THE EMBODIMENTS

Reference will now be made in detail to the preferred embodiments of the present invention, examples of which are illustrated in the accompanying drawings.

The present invention ensures accurate capacitance and increases wafer level uniformity by patterning capacitor electrodes and a dielectric layer, using a negative slope photoresist (PR) lift-off method instead of repeated mask forming process, and by depositing the dielectric layer using an anisotropic sputtering method.

Figure 2A:
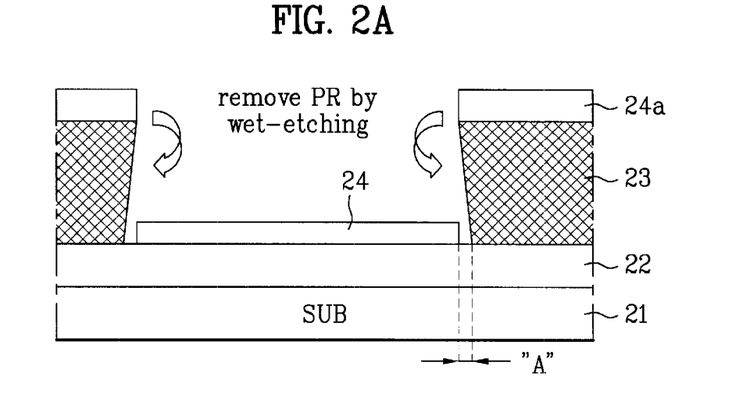
FIGS. 2A to 2F are sectional views illustrating process steps for fabricating a ferroelectric capacitor according to the present invention.

As shown in FIG. 2A, a first photoresist is deposited on a lower oxide layer 22 (i.e., a first insulating layer) of a substrate 21 and then patterned with sides having a negative slope, so that lower oxide layer 22 is selectively exposed.

In other words, the first photoresist is patterned having sides with a negative slope from an upper portion of the sides to a lower portion of the sides so that a first negatively sloped mask 23 is formed.

With negatively sloped mask 23, a metal layer for forming a capacitor lower electrode 24 of, for example, Pt is deposited by an anisotropic sputtering method using first negatively sloped mask 23.

In this case, the metal layer does not come into contact with the side of first negatively sloped mask 23 and is deposited spaced apart from the first negatively sloped 23, as shown by portion "A" in FIG. 2A.

This is to reduce possible damage that may occur to a side edge part during the dry etching process of the metal layer.

In this state, if first negatively sloped mask 23 is removed by a lift-off method based on a wet-etching process, metal layer 24a on the first negatively sloped mask 23 is also removed.

Figure 2B:
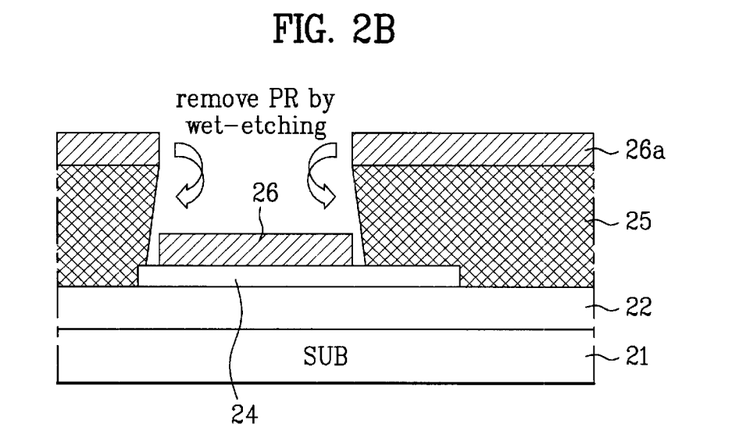

In addition, as shown in FIG. 2B, a second photoresist is deposited on the entire surface of lower electrode 24 and selectively patterned having sides with a negative slope, so that a second negatively sloped mask 25 enabling the lower electrode 24 to be partially exposed is formed.

Then, a ferroelectric material, such as SBT, which is used as a dielectric film for the capacitor, is deposited by an anisotropic sputtering method using second negatively sloped mask 25.

In this case, the ferroelectric material layer is spaced apart from the side of second negatively sloped mask 25 due to the negative slope of mask 25.

The ferroelectric material layer is formed in a part excluding the contact region of lower electrode 24.

With the deposition of such ferroelectric material, a ferroelectric layer 26 is formed on lower electrode 24, and a ferroelectric layer 26a, which will be removed in a later process, is formed on the second negatively sloped mask 25.

If second negatively sloped mask 25 is removed with a wet lift-off method, ferroelectric material layer 26a is also removed at the same time.

Figure 2C:
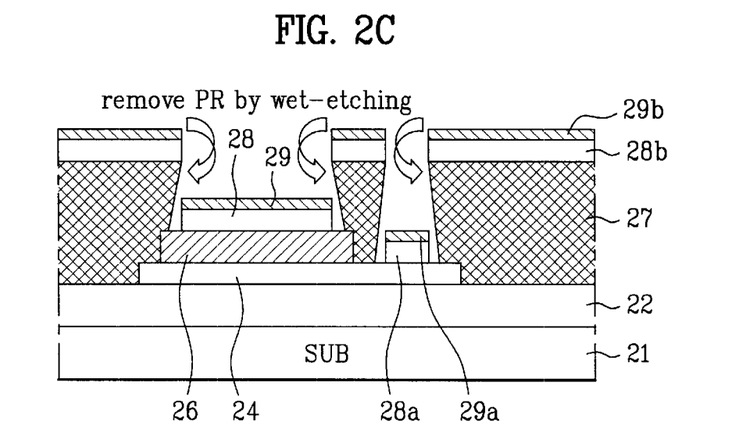

Next, as shown in FIG. 2C, a third photoresist is deposited on the entire surface, in which ferroelectric layer 26 is formed, and then selectively patterned to partially expose ferroelectric layer 26 and the lower electrode. Thus, a third negatively sloped mask 27 is formed. In this case, the third photoresist is removed from the forming region of the upper electrode and the contact region of the lower electrode.

Subsequently, a metal layer for forming an upper electrode, such as Pt, is deposited by an anisotropic sputtering process using third negatively sloped mask 27, and a barrier material, such as TiN, is continually deposited.

With the deposition of the metal layer and the barrier material, an upper electrode 28 and a barrier material layer 29 are formed on ferroelectric material layer 26, and a metal layer 28a and a barrier material layer 29a are also formed on the contact region of lower electrode 24.

Evidently, a metal layer 28b and a barrier material layer 29b are also formed on third negatively sloped mask 27.

Because metal layer 28a and barrier material layer 29a are formed on the contact region of lower electrode 24, any degradation of capacitor electrode, caused by an increase in contact resistance, can be controlled.

If third negatively sloped mask 27 is removed by a wet lift-off method, metal layer 28b and barrier material layer 29b are also removed at the same time.

Figure 2D:
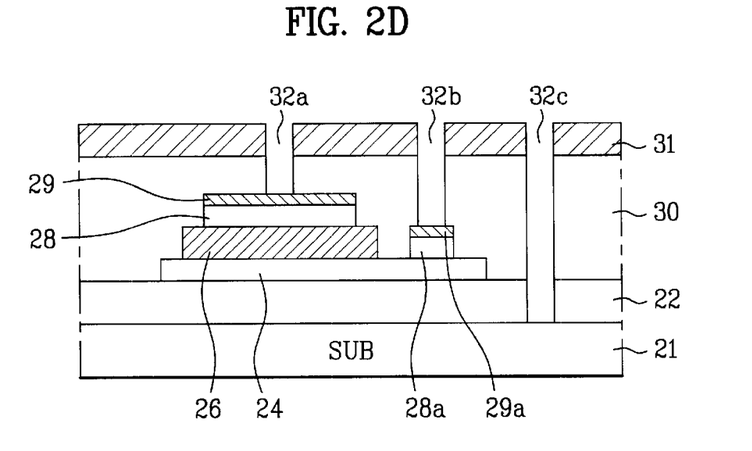

In addition, as shown in FIG. 2D, an oxide layer 30 (i.e., a second insulating layer), which functions as a PMD, is deposited on the entire surface and polished. Then, a fourth photoresist 31 is deposited on the entire surface of the oxide layer 30 and selectively patterned.

By selectively etching oxide layer 30 using the patterned fourth photoresist 31, a partial surface of barrier material layer 29 on upper electrode 28, a partial surface of barrier material layer 29a on lower electrode 24, and a line contact region excluding the capacitor forming region, are exposed to form a first contact hole 32a, a second contact hole 32b, and a third contact hole 32c, respectively.

Figure 2E:
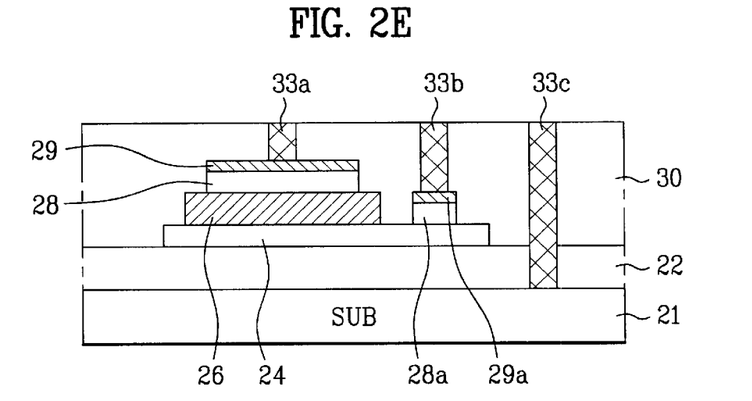

Subsequently, as shown in FIG. 2E, fourth photoresist 31 is removed. Multilayered metals with layers such as Ti, TiN, and W having thickness of 100 Å, 300 Å, and 5000 Å respectively are deposited. Then, plug layers 32a, 32b, and 32c are formed on the entire surface by a dry etching process to respectively bury first contact hole 33a, second contact hole 33b, and third contact hole 33c.

Figure 2F:
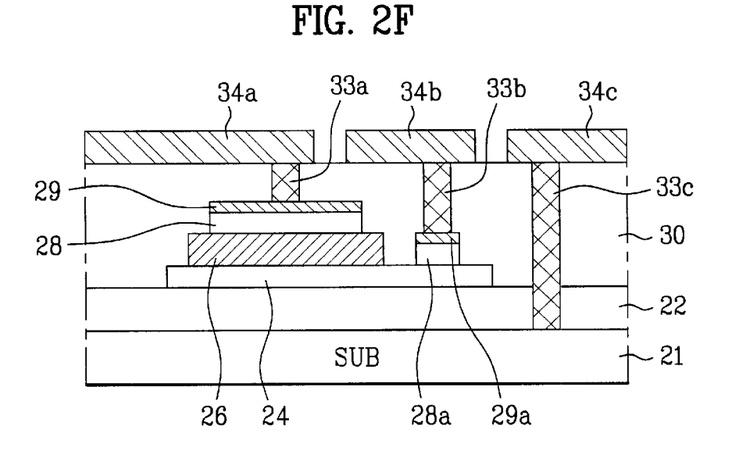

Finally, as shown in FIG. 2F, on the entire surface whereof plug layers 32a, 32b, and 32c are formed, multilayered metals with layers such as Ti, TiN, and Al having a thickness of 100 Å, 150 Å, and 15000 Å respectively are deposited and selectively patterned to form metal line layers 34a, 34b, and 34c.

Processes for fabricating a ferroelectric capacitor of a semiconductor device according to the present invention is not merely limited to the aforementioned described process. For example, Cu, which is difficult to use in a dry etching process, may be used as an electrode material, or another ferroelectric material, such as PZT, may be applied in the same process as well.

As aforementioned, methods for fabricating ferroelectric capacitors in semiconductor devices according to the present invention have the following advantages.

Since the electrode material, which is difficult to handle in a dry etching process, is patterned by a negatively sloped PR lift-off method, edge parasitic capacitance resulting from side damage of the electrode can be controlled.

In addition, since the electrode materials and ferroelectric materials are deposited by anisotropic sputtering, capacitance in an equal wafer level can be obtained. This, therefore, allows fabrication of an analog capacitance devices that provide a high performance.

Furthermore, the dry etching process is not used during the patterning process for electrodes, thus ensuring processing stability.

Finally, before forming each of the contact holes, a barrier layer is formed first, thereby solving problems related to degradation of device characteristics, which result from residue left on the barrier layer around contact holes.

The forgoing embodiments are merely exemplary and are not to be construed as limiting the present invention. The present teachings can be readily applied to other types of apparatus. The description of the present invention is intended to be illustrative, and not to limit the scope of the claims. Many alternatives, modifications, and variations will be apparent to those skilled in the art.

What is claimed is:

1. A method for fabricating a ferroelectric capacitor in a semiconductor device comprising:

forming a first insulating layer on a substrate and forming a first negatively sloped mask having negatively sloped sides from an upper portion of the sides to a lower portion of the sides;

forming a capacitor lower electrode on the first insulating layer using the first negatively sloped mask;

forming a second negatively sloped mask having negatively sloped sides from an upper portion of the sides to a lower portion of the sides to expose a partial surface of the lower electrode and forming a ferroelectric layer on the lower electrode using the second negatively sloped mask;

forming a third negatively sloped mask having a negatively sloped sides from an upper portion of the sides to a lower portion of the sides to expose a partial surface of the ferroelectric layer and forming an upper electrode and a barrier layer on the ferroelectric layer using the third negatively sloped mask;

forming a second insulating layer on an entire surface and selectively etching to form contact holes; and forming plug layers by burying the contact holes and metal lines connected with the plug layers.

2. The method of claim 1, wherein the first negatively sloped mask, the second negatively sloped mask, and the third negatively sloped mask are removed in a lift-off method using a wet etching process, so that material layers respectively deposited on the surfaces of the first negative slope mask, the second negatively sloped mask, and the third negatively sloped mask are removed with the masks.

3. The method of claim 1, wherein the material layer for forming a lower electrode, the ferroelectric layer, and the upper electrode and the barrier layer are deposited by an anisotropic sputtering process using the first negatively sloped mask, the second negative slope mask, and the third negatively sloped mask, respectively.

4. The method of claim 1, wherein the first negatively sloped mask, the second negatively sloped mask, and the third negatively sloped mask respectively used when depositing the material layer for forming a lower electrode, the ferroelectric layer, and the upper electrode and the barrier layer are not in contact with deposition materials at their sides.

5. The method of claim 1, wherein a material layer for forming an upper electrode and a barrier layer are formed in a contact region of the lower electrode, in which the ferroelectric material layer is not formed, during the step of forming an upper electrode and a barrier layer on the ferroelectric material layer.

6. The method of claim 5, wherein the upper electrode and the barrier layer on the ferroelectric material layer are deposited having an equal surface area, and the material layer for forming an upper electrode and the barrier layer on the contact region of the lower electrode are also deposited with an equal surface area.

7. The method of claim 1, wherein a first insulating layer and a second insulating layer are formed with an oxide material.

8. The method of claim 1, wherein Pt is used to form the lower electrode and the upper electrode, and Strontium Bismuth Tantalate (SBT) layer is used to form the ferroelectric layer.

9. The method of claim 1, wherein the barrier layer is formed by depositing TiN.

10. The method of claim 1, wherein the contact holes are formed by etching, at the same time, the second insulating layer of each contact region within the regions excluding the region for contacting the upper electrode, the region for contacting the lower electrode, and the regions for forming a capacitor of each electrode.

11. The method of claim 10, wherein the etching process of the second insulating layer for forming the contact holes are carried out after a polishing process of the second insulating layer.

12. The method of claim 1, wherein the plug layers are formed of multilayered metals deposited with Ti, TiN, and W, respectively.

13. The method of claim 12, wherein each metal layer has a thickness of 100 Å, 300 Å, and 5000 Å, respectively.

14. The method of claim 12, wherein multilayered metals is formed to bury the contact holes and polished by a dry etching process of the entire surface to leave the multiplayer metal only inside the contact holes.

15. The method of claim 1, wherein the metal line is formed of multilayered metals deposited with Ti, TiN, and Al, respectively.

16. The method of claim 15, wherein the thickness of each metal layer are of 100 Å, 150 Å, and 15000 Å, respectively.

* * * * *